US010432151B2

(12) United States Patent
Lesso et al.

(10) Patent No.: US 10,432,151 B2
(45) Date of Patent: Oct. 1, 2019

(54) AUDIO AMPLIFIERS

(71) Applicant: Cirrus Logic International Semiconductor Ltd., Edinburgh (GB)

(72) Inventors: John Paul Lesso, Edinburgh (GB); Toru Ido, Yokohama (JP)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/988,823

(22) Filed: May 24, 2018

(65) Prior Publication Data

US 2018/0351515 A1    Dec. 6, 2018

Related U.S. Application Data

(60) Provisional application No. 62/514,306, filed on Jun. 2, 2017.

(30) Foreign Application Priority Data

Jul. 11, 2017    (GB) .................................... 1711160.0

(51) Int. Cl.
*H03F 3/68*    (2006.01)
*H04B 15/00*    (2006.01)
(Continued)

(52) U.S. Cl.
CPC ......... *H03F 1/3264* (2013.01); *H03F 1/0205* (2013.01); *H03F 1/3247* (2013.01);
(Continued)

(58) Field of Classification Search
CPC ...... H03F 2200/03; H03F 1/32; H03F 1/3229; H03F 1/3264; H03F 1/34; H03F 1/3247;
(Continued)

(56) References Cited

U.S. PATENT DOCUMENTS 5,815,585 A     9/1998  Klippel
5,848,169 A  *  12/1998  Clark, Jr. ............. G10K 11/178
                                                              381/71.13
(Continued)

FOREIGN PATENT DOCUMENTS

GB     2540441 A1   1/2017
WO   03/015263 A1   2/2003

OTHER PUBLICATIONS

Combined Search and Examination Report, UKIPO, Application No. GB1711160.0, dated Jan. 11, 2018.
(Continued)

*Primary Examiner* — George C Monikang
(74) *Attorney, Agent, or Firm* — Jackson Walker L.L.P.

(57) ABSTRACT

This application relates to methods and apparatus for amplification of audio signals with improved audio performance. An audio driving circuit has an amplifier module in a forward signal path between an input for receiving an input audio signal ($S_{IN}$) and an output for outputting an audio driving signal ($V_{OUT}$). A pre-distortion module is operable to apply a first transfer function to the signal in the forward signal path upstream of the amplifier module, wherein the first transfer function comprises a non-linear distortion function based on at least one distortion setting. An error block is arranged to receive a first signal ($S_{FF}$) derived from the input signal and a second signal ($S_{FB}$) indicative of the voltage of the audio driving signal and determine a first error signal ($\varepsilon_1$) indicative of a difference between the first and second signals. The pre-distortion module is operable to control the distortion setting(s) based on the first error signal.

18 Claims, 5 Drawing Sheets

(51) Int. Cl.
*H04R 3/02* (2006.01)
*H03F 1/32* (2006.01)
*H03F 3/187* (2006.01)
*H04R 3/04* (2006.01)
*H03F 1/02* (2006.01)
*H03F 3/217* (2006.01)
*H04R 1/10* (2006.01)

(52) U.S. Cl.
CPC ........... *H03F 1/3258* (2013.01); *H03F 3/187* (2013.01); *H03F 3/217* (2013.01); *H04R 3/04* (2013.01); *H03F 2200/03* (2013.01); *H03F 2200/102* (2013.01); *H03F 2200/129* (2013.01); *H03F 2200/171* (2013.01); *H03F 2200/267* (2013.01); *H03F 2201/3215* (2013.01); *H04R 1/1025* (2013.01); *H04R 2460/03* (2013.01)

(58) Field of Classification Search
CPC .............. H03F 1/52; H03F 2201/3233; G10H 2210/311; G10H 1/16
USPC .................................. 381/28, 83, 93, 96, 120
See application file for complete search history.

(56) References Cited

U.S. PATENT DOCUMENTS

| 7,362,821 | B1 | 4/2008 | Shirali | |
| 9,607,628 | B2 | 3/2017 | Gautama | |
| 2007/0291953 | A1* | 12/2007 | Ngia | G10L 15/02 |
| | | | | 381/71.6 |
| 2013/0222059 | A1 | 8/2013 | Kilambi et al. | |
| 2013/0336494 | A1* | 12/2013 | Bathgate | H03G 9/005 |
| | | | | 381/66 |
| 2014/0029755 | A1* | 1/2014 | Kwon | H04S 7/308 |
| | | | | 381/58 |
| 2015/0371654 | A1* | 12/2015 | Johnston | H04M 9/082 |
| | | | | 381/66 |
| 2016/0232886 | A1 | 8/2016 | Vaidhyanathan et al. | |

OTHER PUBLICATIONS

International Search Report and Written Opinion of the International Searching Authority, International Application No. PCT/GB2018/051396, dated Aug. 10, 2018.

* cited by examiner

AUDIO AMPLIFIERS

This application relates to methods and apparatus for amplification of audio signals, and in particular to amplifiers that may be used to drive different types of load such as headphone amplifiers.

BACKGROUND

Various electronic devices have audio driver, i.e. amplifier, circuitry for driving an audio signal to an audio load, e.g. a loudspeaker, and often devices may have a connector, in the form of a plug and socket for example, for outputting audio signals to an external device. The external device could be a peripheral device such as a headset with relatively small loudspeakers, e.g. located in earphones or earbuds or the like. Such headset loudspeakers will typically have a relatively low impedance, say of the order of a few ohms or so.

For high quality sound reproduction the distortion of the audio signal, especially THD (total harmonic distortion) and intermodulation distortion, should be low. Various factors may contribute to distortion in an amplifier circuit driving a load. Typically the distortion is worst for lower impedance loads. An amplifier may be designed to maintain adequately low distortion into a low impedance load by increasing the output stage quiescent current, generally requiring larger output driving devices and higher current pre-driver stages. Distortion may also be managed by designing the amplifier circuitry with multiple amplifier stages to attempt to suppress output distortion by a high open-loop amplifier gain. However these approaches generally increase both the power consumption of the amplifier circuitry and the size and complexity, and hence cost, of the circuitry.

For many electronic devices, e.g. especially for battery powered devices where power demands impact on battery life, power efficiency of the components of the device may be a concern. Higher power consumption may also have associated cooling requirements. The size and cost of components are also of concern for such applications.

SUMMARY

Embodiments of the present disclosure relate to methods and apparatus for audio amplification that mitigate at least of the above mentioned issues.

Thus according to the present invention there is provided an audio driving circuit comprising:
  a forward signal path between an input for receiving an input audio signal and an output for outputting an audio driving signal;
  an amplifier module in the forward signal path;
  a pre-distortion module operable to apply a first transfer function to a signal in the forward signal path upstream of the amplifier module, wherein the first transfer function comprises a non-linear distortion function based on at least one distortion setting; and
  an error block for receiving a first signal derived from the input signal and a second signal indicative of the voltage of the audio driving signal and determining a first error signal indicative of a difference between the first and second signals;
  wherein the pre-distortion module is operable to control said at least one distortion setting based on the first error signal.

In some embodiments the error block may comprise a first processing module configured to apply a first linear transfer function to one of the first signal or the second signals, to compensate for a linear transfer function of the forward signal path, prior to determining the first error signal. The first processing module may comprise a finite impulse response filter or an infinite impulse response filter.

In some embodiments the first processing module is configured such that the first linear transfer function is adaptive based on a second error signal, where the second error signal is indicative of a difference between the first and second signals after the first linear transfer function has been applied. The first processing module may be configured to apply a least-mean-squares adaptation or a recursive-mean-squares adaptation to the first linear transfer function based on the second error signal.

In some implementations the first processing module is configured to apply the first linear transfer function to the first signal. In other implementations the first processing module is configured to apply the first linear transfer function to the second signal. In some embodiments the first processing module is configured to apply the first linear transfer function to one of the first signal or the second signal and a second processing module is configured to apply a second linear transfer function to the other of the first signal or the second signal.

In some implementations a gain element may be configured to apply a gain to one of the first or second signals to compensate for a gain in the forward signal path.

The circuit may also comprise an analogue-to-digital conversion module for receiving an analogue feedback signal derived from the audio driving signal and outputting a corresponding digital signal as said second signal. The analogue-to-digital conversion module may comprise an analogue-to-digital converter (ADC) and an analogue gain element configured to apply analogue gain to the analogue feedback signal before the ADC. The analogue gain element may be configured to apply the analogue gain to so as to limit the input to the ADC to lie within a first predetermined voltage range that corresponds to a linear operating range of the ADC. The analogue-to-digital conversion module may further comprise a digital gain element for applying digital gain to a signal output from the ADC. The digital gain may at least partly reverse the analogue gain applied by the analogue gain element. The analogue-to-digital conversion module may comprise a gain controller for controlling the analogue gain and the digital gain based on an indication of the magnitude of the audio driving signal. The indication of the magnitude of the audio driving signal may be derived from the input signal. In some instances, where the audio driving circuit is implemented as an integrated circuit, the analogue-to-digital conversion module may be configured to receive the analogue feedback signal externally from the integrated circuit.

The pre-distortion module may comprise a distortion setting controller configured to apply an adaptation algorithm to adapt said at least one distortion setting based on the first error signal. The adaptation algorithm may comprise a least-mean-square algorithm or a recursive-mean-square algorithm. In some embodiments the pre-distortion module may be configured, on start-up of the audio driving circuit, to generate an initial set of distortion settings to be used as said at least one distortion setting.

The first transfer function may be based on a polynomial function. The at least one distortion setting may thus comprise a set of one or more distortion coefficients for the polynomial function. At least some distortion coefficients may have an associated phase delay component. The pre-distortion module may be configured to apply a distortion component corresponding to each distortion coefficient at a respective delay indicated by the respective phase delay component. In some embodiments the pre-distortion module determines the polynomial coefficients according to a Volterra kernel.

The audio driving circuit may be implemented as an integrated circuit. Embodiments also relate to an audio apparatus having an audio driving circuit as described in any of the variants above. The output of the audio driving circuit may be coupled to an output audio path that comprises at least one non-linear component. In which case the second signal indicative of the voltage of the audio driving signal may derived from the output audio path downstream of the at least one non-linear component. The audio apparatus may further comprise a first connector for removably connecting to a mating second connector of a peripheral device and the apparatus may be operable, in use, to supply the audio driving signal to the first connector for driving an audio transducer of a connected peripheral device. The audio apparatus may be at least one of: a battery powered device; a portable device; a communications device; a mobile telephone; a smartphone; a computing device; a laptop; notebook or tablet computer; a gaming device; a personal media player; a wearable device; a voice controlled device.

In another aspect there is provided a method of driving an audio transducer comprising:
  receiving an audio signal;
  applying a first transfer function to the audio signal, where the first transfer function comprises a non-linear distortion function based on at least one distortion setting;
  amplifying the audio signal to which the first transfer function has been applied; and
  outputting the amplified audio signal as an audio driving signal;
  wherein the method further comprises receiving a first signal derived from the input signal and a second signal indicative of the voltage of the audio driving signal and determining a first error signal indicative of a difference between the first and second signals; and
  controlling the at least one distortion setting based on the first error signal.

In a further aspect there is provided an audio driving circuit for receiving an input audio signal and an output for outputting an audio driving signal, the audio driving circuit comprising:
  an amplifier;
  a pre-distortion module operable to apply an adaptive non-linear distortion function to the input audio signal;
  an error block for determining a first error signal indicative of any error between the input audio signal and the audio driving signal based on a feedback signal of the voltage of the audio driving signal;
  wherein the pre-distortion module comprises a controller for adapting the non-linear distortion function applied based on the first error signal.

The error block may comprise a linear filter for compensating for a linear transfer function between the input signal and the audio driving signal.

In a further aspect there is provided an audio driving circuit comprising:
  a pre-distortion module operable to apply an adaptive non-linear distortion function to an input audio signal;
  an amplifier for amplifying the output of the pre-distortion module to provide an audio driving signal;
  a controller for adapting the non-linear distortion function applied based on a first error signal; and
  an error block configured to receive the input audio signal and a feedback signal of the voltage of the audio driving signal, to apply a first linear transfer function to the input audio signal or the feedback signal to at least partly compensate for a linear transfer function associated with the amplifier and to determine an error between the input audio signal and the feedback signal after the linear transfer function is applied as the first error signal.

BRIEF DESCRIPTION OF THE DRAWINGS

Embodiments will now be described by way of example only with reference to the accompanying drawings, of which.

DETAILED DESCRIPTION

Embodiments of the invention provide amplifier circuitry and methods of amplification that are operable to provide good distortion performance. Amplifier circuits according to embodiments of the disclosure may be relatively small in circuit area and/or have relatively low power requirements compared to conventional amplifiers of similar performance.

Figure 1:
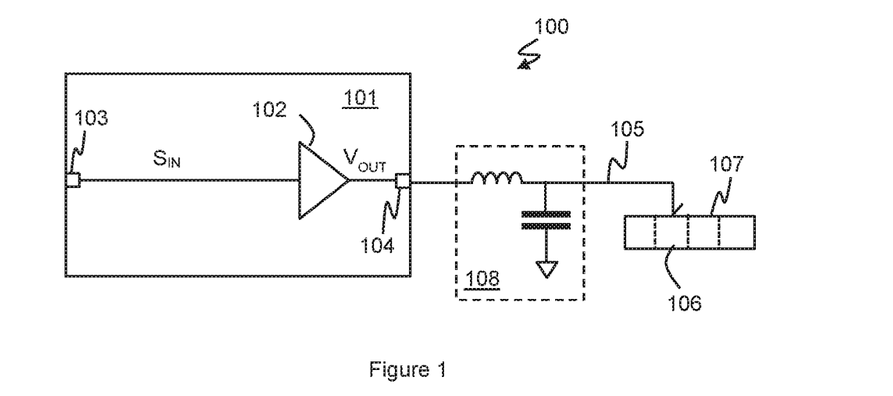
FIG. 1 illustrates a typical amplifier circuit arrangement.

FIG. 1 illustrates one example of a typical audio amplifier arrangement 100 for driving an audio transducer, such as a loudspeaker, with a driving signal. An audio driving circuit 101, such as an audio codec, comprises an amplifier module 102 for providing the audio driving signal $V_{OUT}$ for driving the audio transducer based on an input signal $S_{IN}$, which may be an input digital signal, received at an input node 103. The input node 103 could be a suitable pin of the codec 101 or may just be a node of a signal path, for instance coupled to the output of some upstream processing block. The amplifier module 102 will typically comprise at least one amplifier stage and, depending on the type of amplifier, may include a DAC (digital-to-analogue converter) to convert a received digital signal into an analogue signal for amplification, although in some instances the amplifier module 102 may comprise an amplifier, such as a class-D amplifier, that operates with digital inputs.

The output audio driving signal $V_{OUT}$ is output from the audio driving circuit 101 via a suitable output node 104, for example an output pin of the codec, and propagated from the output node 104 to the relevant audio transducer via an audio signal path 105. Where the audio driving circuit 101 is formed as an integrated circuit, i.e. on a chip, the signal path 105 will be at least partly, if not wholly, external to the integrated circuit, i.e. off-chip, and may, for example, be at least partly formed on a circuit board of the host device, i.e. the device within which the audio driving circuit 101 is located. In some instances the amplifier module 102 may be used to drive an audio transducer, e.g. loudspeaker, of an apparatus which is external to the host device, for instance an accessory apparatus, such as a headset, that may be removably connected to the host device, in use, for transfer of audio signals. The signal path 105 may thus connect, in use, the output terminal 104 of the audio driving circuit 101 to a suitable contact 106 of a connector 107 of the host device. The connector 107 may be any suitable connector for making a connection with an external apparatus. The connector may for example be a jack socket for making a mating connection with a corresponding jack plug, such as a TRS or TRRS jack plug, or may be some other suitable receptacle such as a USB receptacle or socket. In such cases the amplifier module 102 may thus be connected, at times, to drive any of a variety of different audio loads, from small speakers of earbuds or the like, to larger headset speakers or speakers of some docking station or similar apparatus.

There will typically be at least some distortion introduced into the audio driving signal $V_{OUT}$ due to the amplifier module 102. Previously it may have been assumed that such an amplifier circuit, e.g. a headphone amplifier circuit, would mainly be used to drive some relatively low quality headphones and thus the requirements for the distortion performance of the amplifier may have been relatively low. Increasingly it is desired that such audio circuits be capable of driving such an array of different loads and with relatively low levels of distortion.

As mentioned above, amplifiers may be designed to maintain adequately low distortion through the use of relatively large output stage quiescent currents and/or using multiple amplifier stages with a high open-loop amplifier gain, but these approaches require relatively high power consumption and/or a relatively large circuit area for the amplifier and, especially for portable electronic devices, power and size are important considerations. Generally it is desired to keep power and size requirements as low as possible.

Also, in some instances the external or off-chip audio signal path 106, which may for instance be a path on a circuit board, may comprise various components 108 that exhibit non-linear behaviour. For instance it is common for EMI (electromagnetic interference) reduction to filter the signal path 106, which may typically use ferrite based filtering. A ferrite bead provides a series inductance for the signal path with a capacitor providing a defined impedance to ground. Such non-linear components can add to the distortion in the audio driving signal supplied to the audio transducer.

Embodiments of the present disclosure relate to audio driving circuits having an amplifier module in a signal path. A pre-distortion module is operable to apply a first transfer function to the signal path upstream of the amplifier module, where the first transfer function comprises a non-linear distortion function based on at least one distortion setting. The pre-distortion module is operable to control the distortion setting(s) based on a first error signal determined by an error block. The error block receives a first signal derived from the input signal and a second signal indicative of the voltage of the audio driving signal and determines first error signal, which is indicative of a difference between the first and second signals.

In embodiments of the disclosure an error which is determined between the input signal and a feedback signal of the voltage of the output signal is used to control a non-linear adjustment or correction applied to the input audio signal so as to mitigate for the effects of non-linearity associated with the amplifier and/or downstream signal path to the audio transducer.

Figure 2:
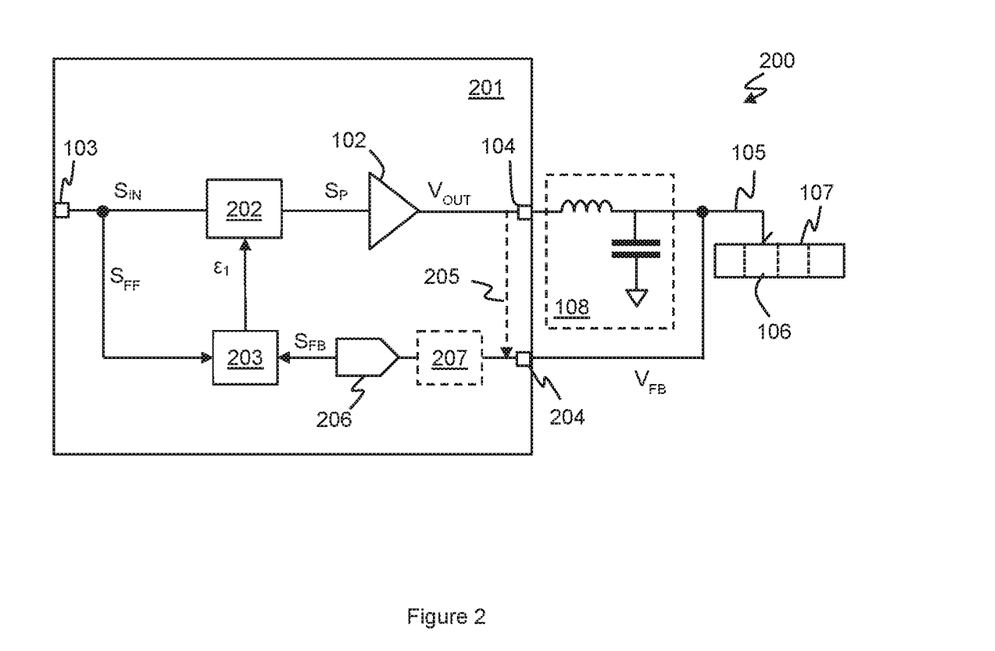
FIG. 2 illustrates an amplifier circuit arrangement according to an embodiment.

FIG. 2 illustrates one general amplifier arrangement 200 according to an embodiment, in which the same reference numerals as FIG. 1 are used to denote similar components.

In this embodiment audio circuit 201, which may be an integrated circuit such as a codec or the like, has an amplifier module 102 in a forward signal path between input node 103, for receiving an input signal $S_{IN}$, and output node 104, for outputting the audio driving signal $V_{OUT}$. As discussed previously the input node 103 may be an input terminal for the circuit 201, e.g. a circuit pin or the like, or may be a node of the circuit, e.g. some suitable part of a signal path of the integrated circuit, e.g. the output of a signal processing block. The input signal $S_{IN}$ may conveniently be a digital input signal.

The amplifier module 102 amplifies the signal in the forward signal path to produce an audio driving signal at the output node 104, which is propagated, in use, to a relevant audio transducer such as a loudspeaker via a signal path 105 that may include non-linear components 108. As discussed above the transducer may be a transducer of an external device connected, in use, via a contact 106 of connector 107, e.g. via a tip or ring contact of a jack socket for example.

In the embodiment of FIG. 2 a pre-distortion module 202 is provided to apply a first transfer function, which is a non-linear distortion function, to the signal in the signal path upstream of amplifier module 102. The pre-distortion module 202 may thus receive the input signal $S_{IN}$ and apply the first transfer function to produce a processed signal $S_P$ which is then propagated to the amplifier module 102 to generate the audio driving signal $V_{OUT}$. As will be discussed in more detail below the pre-distortion module 202 effectively pre-distorts the input signal $S_{IN}$ in a way that attempts to compensate for the distortion introduced by downstream components in the driving circuit 201 or downstream signal path to the audio transducer, e.g. the amplifier module 102 and/or non-linear element 108 of signal path 105.

The pre-distortion module 202 thus effectively attempts to apply a non-linear transfer function to the input signal $S_{IN}$ that at least partly compensates for the non-linear distortions experienced by the signal in the signal path downstream of the pre-distortion module 202. The first non-linear transfer function can thus be seen as an estimate of the inverse of a transfer function that describes the distortion in the signal path. If such a distortion function for the signal path were known, a relevant first transfer function could be derived. However a distortion function for the signal path may vary for different loads that may be connected and/or may vary with operating conditions. The distortion function for the signal path may also vary over time due to ageing effects associated with the system and/or circuitry.

The pre-distortion module 202 is thus operable to apply an adaptive non-linear function, i.e. a non-linear transfer function that may be controllably varied. The first non-linear distortion function varies based on at least one distortion setting, and the pre-distortion module 202 controls the distortion setting(s) based on a first error signal $\varepsilon_1$ which is indicative of an error between the input signal $S_{IN}$ and the resulting audio driving signal $V_{OUT}$. The first error signal $\varepsilon_1$ is thus a measure of distortion present in the audio driving signal $V_{OUT}$. The pre-distortion module 202 adapts the non-linear distortion function applied, by controlling the at least one distortion setting, to try to limit this indication of error to some acceptable limit. In this way the pre-distortion module 202 adapts the first transfer function which is applied to become a reasonable inverse of whatever the non-linear transfer function of the signal path happens to be.

The pre-distortion module 202 receives the first error signal $\varepsilon_1$ from an error block 203. The error block 203 receives a first feed-forward signal $S_{FF}$ that is derived from the input signal $S_{IN}$ upstream of the pre-distortion module 202. In some embodiments the first signal $S_{FF}$ may simply be a tapped version of the input signal $S_{IN}$. The error block 203 also receives a second signal $S_{FB}$ which is a feedback signal indicative of the voltage of the audio driving signal $V_{OUT}$ downstream of the pre-distortion module 202.

In some embodiments a voltage feedback signal $V_{FB}$ may be tapped from the signal path 105 which is downstream of the output node 104. In particular the voltage feedback signal $V_{FB}$ may be derived from the signal path 105 downstream of at least some non-linear components 108 of the signal path 105, so that the feedback signal includes the effects of such non-linear components on the audio driving signal applied to the load. This will allow the pre-distortion module 202 to adapt the first transfer function applied to at least partly compensate for any distortion from such non-linear components. Where the amplifier circuit 201 is an integrated circuit, such as a codec or the like, the voltage feedback signal $V_{FB}$ may thus be an external, i.e. off-chip, feedback signal that is received at some suitable connection 204, e.g. pin, of the circuit 201. This may however require a suitable circuit terminal or pin to be provided, which may increase pin count and increase chip area. In some embodiments therefore where no such circuit pin or terminal is available or desirable and/or the effect of any off-chip non-linearity is not deemed significant, the audio driving signal $V_{OUT}$ may be tapped on chip to provide the voltage feedback, as illustrated by dotted path 205.

In either case, the voltage feedback signal $V_{FB}$ will generally be an analogue signal. An analogue-to-digital converter (ADC) 206 may thus convert the voltage feedback signal $V_{FB}$ into a digital signal. In some embodiments, an anti-aliasing filter 207 may be provided upstream of the ADC 206 in the feedback path, although such a filter may not be needed if the analogue voltage feedback signal $V_{FB}$ is tapped from the signal path 105 downstream of elements 108 that provide some filtering. The output from the ADC 206 may be provided to the error block as the second signal $S_{FB}$ indicative of the audio driving signal.

The error block 203 may thus receive the first signal $S_{FF}$, which is a version of the digital input signal $S_{IN}$, and also the second signal, $S_{FB}$, which is a digital version of the voltage feedback signal and thus indicative of the audio driving signal $V_{OUT}$, and determine the difference between these first and second signals. The resulting difference can be supplied to the pre-distortion module 202 from the error block 203 as the first error signal $\varepsilon_1$. This first error signal $\varepsilon_1$ will have a signal component related to the distortion of the audio driving signal at the relevant point from which the voltage feedback signal $V_{FB}$ is tapped.

The error block 203 may produce the first error signal $\varepsilon_1$ by simply subtracting the first signal $S_{FF}$ from the second signal $S_{FB}$.

In some implementations however the amplifier module 102 may have a transfer characteristic which has a linear component that is non-unity. For example the amplifier module 102 may be configured to deliberately apply a gain greater than unity. The voltage feedback signal $V_{FB}$ will include the effects of any non-linear distortion, which it is wished to correct, but will also include the effects of any linear gain, which may lead to an apparent error between the second signal $S_{FB}$ and the first signal $S_{FF}$.

Figure 3:
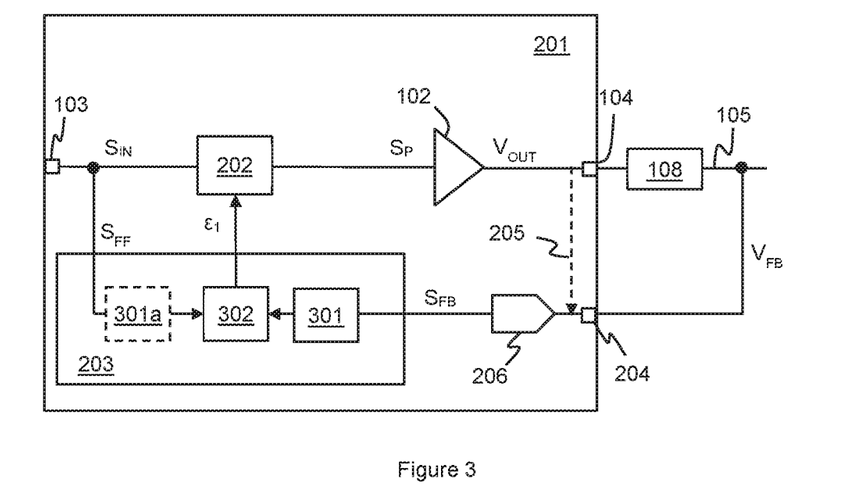
FIG. 3 illustrates an amplifier circuit arrangement that applies a linear transfer function in an error block.

In some embodiments therefore the error block 203 is configured to process the first signal $S_{FF}$ and/or the second signal $S_{FB}$ to at least partly compensate for a linear transfer function associated with the forward signal path. Thus, as illustrated in FIG. 3, in some embodiments the error block 203 comprises a processing module 301 which is configured to apply a linear transfer function to the received second signal $S_{FB}$, before determining the first error signal $\varepsilon_1$. The linear transfer function is applied to at least partly compensate for a linear transfer function of the forward signal path, so that the error, between the first signal $S_{FF}$ and the processed version of the second signal output from the processing module 301, is substantially due to any non-linear distortion.

The processing module 301 thus applies the linear transfer function to the received second signal $S_{FB}$ and passes the processed signal to determination block 302, which also receives the first signal $S_{FF}$ and determines the first error signal $\varepsilon_1$. The determination block 302 may simply be a digital combiner, e.g. a subtractor, arranged to subtract one digital signal from the other.

FIG. 3 illustrates that processing module 301 applies the linear transfer function to the received second signal $S_{FB}$, i.e. the digital feedback signal indicative of the voltage of the audio driving signal $V_{OUT}$. In such a case the linear function can be seen as attempting to reverse the effects of the linear transfer function associated with the forward signal path. Thus if the linear transfer function associated with the forward signal path were H for example than the linear transfer function applied by processing module 301 could be seen as an estimate of the inverse function H.

Alternatively the processing module could, as illustrated by module 301a, be configured to apply the linear transfer function to the first signal $S_{FF}$ received by the error block 203, in which case the linear transfer function could be an estimate of the function H for the forward signal path. Alternatively in some embodiments it could be possible to have two processing modules 301a and 301 arranged to apply complementary linear transfer functions to the first and second signals $S_{FF}$ and $S_{FB}$ respectively to collectively compensate for the linear transfer function H of the forward signal path.

In at least some embodiments however it may be preferable to arrange the processing module to apply the linear transfer function to the second signal $S_{FB}$, as illustrated by processing module 301, without any significant processing of the first signal $S_{FF}$. In this way the linear transfer function applied by the processing module 301 is part of the feedback path and thus contributes to both the signal-transfer function (STF) for the whole circuit and the noise transfer function (NTF), i.e. the STF and NTF have the same components, whereas this would not be the case were the linear transfer function applied to the first signal $S_{FF}$.

The embodiment of FIG. 3 thus compensates for the linear component of the transfer function of the forward path, so that the resulting first error signal $\varepsilon_1$ is a representation of just any non-linear distortions present in the audio driving signal. A separate compensation for the non-linear distortion is applied in the forward signal path.

As mentioned above the linear transfer function applied by the processing module 301 may, in effect, be based on an estimate of a linear transfer function H associated with the forward signal path, e.g. of the amplifier module 102. In use the transfer function H of the forward signal path may vary, for instance a gain associated with amplifier module 102 may be deliberately varied. The transfer function H may also be load dependent and will typically vary with different types of load. As described in respect of FIG. 2, the amplifier module 102 of FIG. 3 will typically comprise at least one amplifier stage and, depending on the type of amplifier, may include a DAC (digital-to-analogue converter) to convert a received digital signal into an analogue signal for amplification, although in some instances the amplifier module 102 may comprise an amplifier, such as a class-D amplifier, that operates with digital inputs.

In some embodiments a controller (not illustrated in FIG. 3) may monitor for deliberate gain changes and/or detect some characteristic of the load when connected and select an appropriate linear transfer function to be applied by the processing module 301/301*a*. However environmental conditions such as temperature, PCB stress, ageing etc. can also have an impact on the transfer function H.

Advantageously therefore in some embodiments the processing module 301 may be adaptive to adapt the linear transfer function applied in use. The linear transfer function may be adapted based on a second error signal that is indicative of a difference between the first and second signals after the linear transfer function has been applied.

Figure 4A:
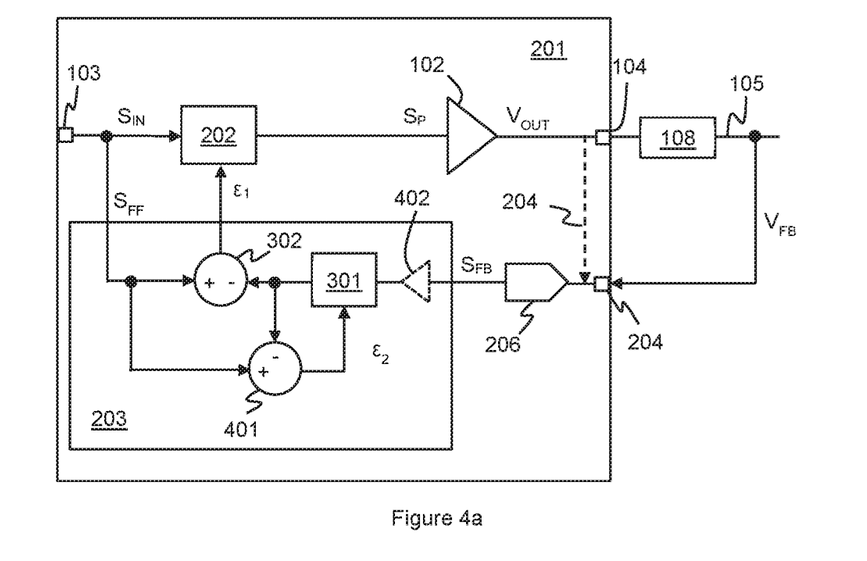
FIGS. 4a and 4b illustrate amplifier circuit arrangements with an adaptive processing module for applying an adaptive linear transfer function.

FIG. 4*a* illustrates an embodiment wherein the processing module 301 of the error block 203 is adaptive to apply an adaptive linear transfer function, in this example to the second signal $S_{FB}$. The processing module 301 adapts the linear transfer function applied based on a second error signal 82 indicative of the difference between the output from the first processing module 301 and the first signal $S_{FF}$. The second error signal $\varepsilon_2$ may be determined by a determination module 401, which may comprise a digital subtractor.

The second error signal $\varepsilon_2$ is thus an indication of the error between the first signal $S_{FF}$ and the second signal $S_{FB}$ after the linear transfer function has been applied. The processing module 301 adapts the linear transfer function to reduce or minimise any error in these signals. In this way the processing module 301 adapts the linear transfer function applied so as compensate the second signal $S_{FB}$ for the linear transfer function H of the forward signal path. The second signal $S_{FB}$ to which the linear transfer function has been applied can then be used, together with the first signal $S_{FF}$, to determine the first error signal which is used to correct for any non-linear distortion.

In some embodiments the processing module 301 may comprise an adaptive filter, for example a finite impulse response (FIR) filter. The FIR filter may be adapted, for example according to a least-mean-squares (LMS) algorithm, for instance a recursive LMS algorithm to minimise the error in the second error signal $\varepsilon_2$ as would be understood by one skilled in the art. In some instances the adaptive filter could be an infinite-impulse-response filter (IIR).

Whilst a suitable adaptive processing module 301 can compensate for substantially any linear component of the transfer function of the forward signal path, in some embodiments there may be a gain element configured to apply a controlled gain to the first signal $S_{FF}$ or the second signal $S_{FB}$ to at least partly account for a known or expected gain the in the forward signal path. For example a digital gain element 402 could be arranged as part of the error block 203 to apply a controlled digital gain to the received second signal $S_{FB}$. The digital gain element 402 may, for instance, compensate for a known gain applied in the forward path. The digital gain element 402 may, in effect, at least partly compensate for a static or DC gain of the forward signal path, and the adaptive processing module 301 compensates for any other difference and any variation over time. This may lead to faster settling on start-up and/or limit the range of signals supplied to the processing module 301, which may be advantageous in relaxing the performance requirements of the processing module 301.

Figure 4B:
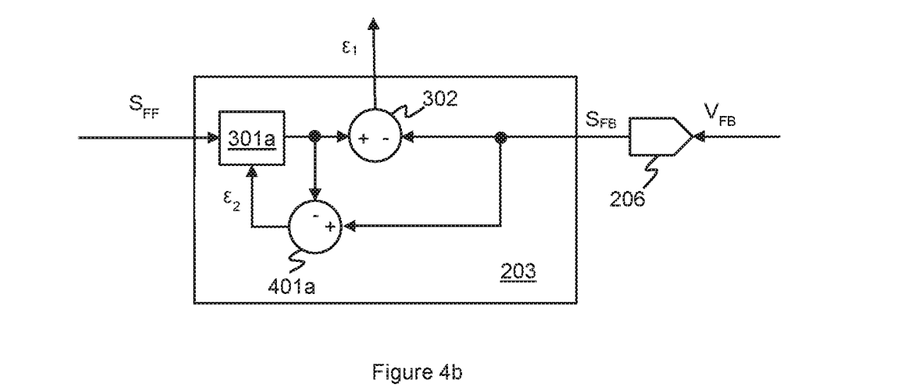

As discussed above the adaptive processing module 301 may advantageously be positioned to act on the second signal $S_{FB}$, i.e. the feedback signal so as to contribute to both the STF and NTF of the amplifier circuit 201. However it would additionally or alternatively be possible to have an adaptive processing module act on the received first signal, as illustrated by processing module 301 of FIG. 4*b* that receives the second error signal from determining module, e.g. digital subtractor 401*a*.

The use of an adaptive processing module, such as an adaptive FIR filter adapted according to an LMS algorithm, can thus correct for errors between the first signal, indicative of the input signal, and the second signal, indicative of the audio driving signal.

It will be appreciated however that any non-linearity introduced by ADC 206 in converting the analogue voltage feedback signal $V_{FB}$ to the digital second signal $S_{FB}$ may also lead to non-linear errors between the second signal $S_{FB}$ and the input signal $S_{IN}$.

Were the first error signal $\varepsilon_1$ used directly to correct or adjust the signal in the forward signal path then any such non-linearity introduced by the ADC 206 would limit the effectiveness of the compensation in the forward signal path. Thus, for any significant improvement in distortion performance of the amplifier circuit, the linearity of the ADC 206 would have to be significantly better than the linearity of the amplifier module 102, which may require a relatively large ADC with relatively high power consumption.

In embodiments of the present disclosure however the first error signal $\varepsilon_1$ is not directly combined with the signal in the forward signal path and instead the first error signal $\varepsilon_1$ is used to control the relevant distortion settings for the pre-distortion module 202. The pre-distortion module 202 is configured to adapt the distortion settings based on the first error signal $\varepsilon_1$ as discussed above.

Figure 5:
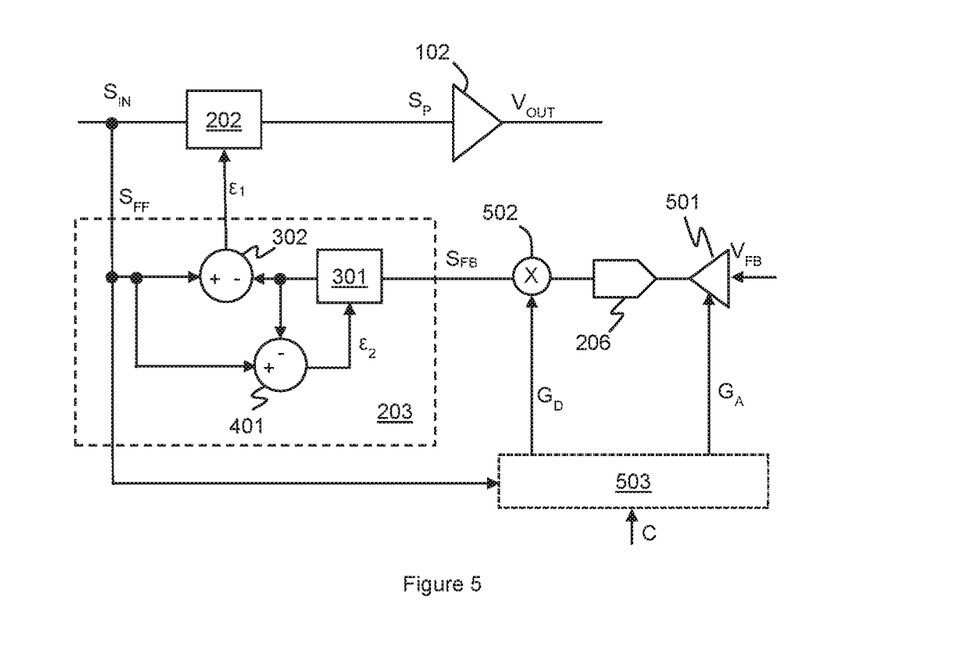
FIG. 5 illustrates an amplifier circuit according to an embodiment with gain in the feedback path.

In some embodiments an analogue gain element may be provided to apply analogue gain to the analogue voltage feedback signal $V_{FB}$ before conversion to digital. In some embodiments the analogue gain may be applied to limit the voltage feedback signal provided to the ADC 206 to a defined operating range, which may be defined to provide acceptable linearity. FIG. 5 illustrates an embodiment where the voltage feedback signal $V_{FB}$ is input to an analogue gain element 501 to apply an analogue gain $G_A$ to the voltage feedback signal upstream of the ADC 206. The analogue gain $G_A$ may be selected to limit the voltage supplied to the ADC 206 to a defined operating range of the ADC 206.

As will be understood by one skilled in the art, most practical ADCs will have a transfer characteristic that is non-linear. That is the relationship between the voltage input to the ADC 206 and the digital output value will not scale entirely linearly with increasing input voltage. The effect of the non-linearity will typically be more pronounced over a wider voltage range. It has therefore been appreciated that if the input signal supplied to the ADC is limited to a relatively limited voltage range the effect of any non-linearity in the ADC conversion is reduced. However, practically there is a limit to the voltage resolution achievable with an ADC that may be implemented without undue size requirements and therefore limiting the voltage range of the input signal $V_{ADC}$ to the ADC 206 will have the effect of increasing the quantisation noise.

The conventional approach for analogue-to-digital conversion may therefore be to maximise the voltage range of the input signal so as to reduce the quantisation noise error in conversion. In this particular application however, where the output of the ADC 206 is to be used to determine any non-linear errors between the input signal and the audio driving signal, and the determined error is used to update the distortion settings of the pre-distortion module 202, it may be beneficial to operate for a relatively reduced operating range compared to what might otherwise be considered, in order to improve linearity at the expense of increased quantisation noise. Given the updated rate of the distortion settings is relatively slow, the feedback signal and/or the first error signal may be filtered or time averaged to improve the noise, i.e. quantisation and/or thermal noise, performance whilst maintaining the linearity benefit.

The analogue gain element 501 may therefore apply the analogue gain $G_A$ to maintain the voltage feedback signal $V_{FB}$ input to the ADC 206 within a defined operating range. In some embodiments the analogue gain element 501 may apply an attenuation to keep the maximum signal level of the voltage feedback signal $V_{FB}$ below a defined voltage, which may, in some embodiments, correspond to only part of the possible operating input range of the ADC 206. As will be understood by one skilled in the art, an ADC will have an operating input range, e.g. a range of voltage that can be input into the ADC and converted without signal clipping. As mentioned, it is usual to ensure that the input to an ADC is limited to lie within input range of the ADC but, it is also usual that, for best conversion performance and lowest quantisation noise, the full input range is used where possible. In some embodiments of the disclosure the input to the ADC 206 may be limited to only part of the operating input range.

In some embodiments a digital gain element 502, for instance a digital multiplier, may be arranged downstream of the ADC 206 to apply a digital gain $G_D$. The digital gain element 502 may apply a positive gain, i.e. boost, to the digital output signal which may, at least partly, compensate for an attenuation applied by the analogue gain element 501.

The analogue gain $G_A$ applied by the analogue gain element 501 and/or any digital gain $G_D$ applied by the digital gain element 502 may, in some instances, be predetermined and hardwired or stored in the relevant gain element. In some implementations however the analogue gain $G_A$ and/or digital gain $G_D$ applied may be controlled by a gain controller 503. The gain controller 503 may control the gain elements to apply fixed gains, but in some embodiments the analogue gain $G_A$ and/or digital gain $G_D$ applied may vary based on some operating parameter. For instance the gain controller may adjust the gain settings $G_A$ and $G_D$ based on a control signal C, which may for example be indicative of the type of load connected and thus an expectation of the maximum amplitude of the audio driving signal $V_{OUT}$ or a volume setting.

In some embodiments the analogue gain $G_A$ and the digital gain $G_D$ may be controlled, in use, based on an indication of the level of the input signal $S_{IN}$. The analogue gain may be decreased (in the sense of applying less positive amplification or more attenuation) for relatively higher input signal magnitudes and increased (in the sense of applying more positive amplification or less attenuation) for relatively lower input signal magnitudes.

Given that the input signal $S_{IN}$ is amplified in the forward signal path to provide the audio driving signal $V_{OUT}$, the magnitude of the voltage feedback signal $V_{FB}$ will depend on the magnitude of the input signal. The principles of dynamic-range-extension (DRE) may be applied, so that, for a defined operating range of the ADC 206 the voltage feedback signal $V_{FB}$ has a gain applied to maximise the use of the defined operating range. Thus, at lower signal levels, less attenuation or more amplification may be applied to the voltage feedback signal $V_{FB}$ so that it makes use of more the defined operating range. The defined operating range may be the whole input range of the ADC 206 or may, as discussed above, be only part of the input range of the ADC 206. The digital gain $G_D$ may be controlled inversely to the analogue gain $G_A$. The input signal $S_{IN}$ provides a suitable look-ahead of what the magnitude of the voltage feedback signal $V_{FB}$ will be, allowing the gain controller 503 to set the relevant gains appropriately.

The output from the digital gain element may be supplied to the error block 203 as the second signal $S_{FB}$ and used to derive the first error signal $\varepsilon_1$.

The first error signal $\varepsilon_1$ is used by the pre-distortion module 202 to control or adapt the first non-linear transfer function applied to the input signal.

The first non-linear transfer function is a function that is applied to the input signal $S_{IN}$ to apply a controlled distortion. The first transfer function is based on at least one distortion setting, which may, for example, be a set of one or more distortion coefficients $\{p_i\}$ for a polynomial function.

The first error signal $\varepsilon_1$ is used by the pre-distortion module 202 to adjust the least one distortion setting of the first transfer function, for instance the one or more distortion coefficients $\{p_i\}$ for a polynomial function. The pre-distortion module 202 will thus apply the first transfer function to the input signal $S_{IN}$ based on the then current distortion settings, to apply a controlled distortion that is intended to compensate for the inherent downstream distortion. The first error signal $\varepsilon_1$ is used to adjust or control the distortion settings in use with the view of controlling the distorting settings so as to minimise the error represented by the first error signal $\varepsilon_1$.

Figure 6:
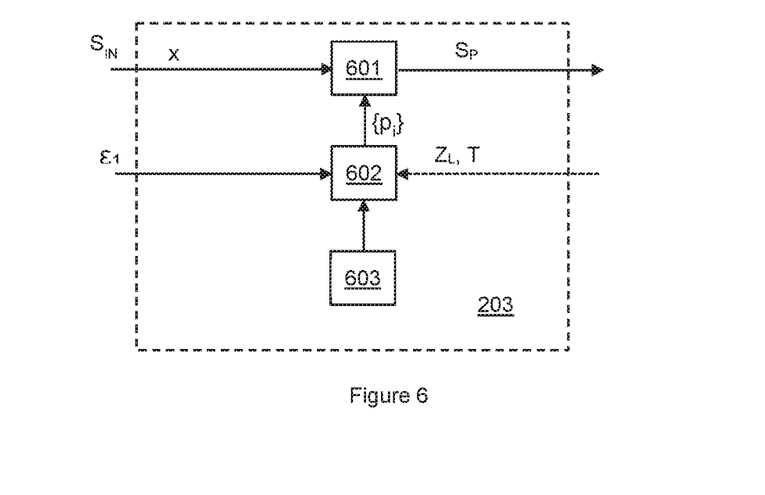
FIG. 6 illustrates an example of a pre-distortion module.

FIG. 6 illustrates one example of a pre-distortion module 202 according to an embodiment. The distortion module receives the input signal $S_{IN}$ which is passed to a transform module 601. The transform module 601 applies a controlled distortion to the input signal $S_{IN}$ that applies the first non-linear transfer function in accordance with one or more distortion settings. The transform module 601 may apply the controlled distortion according to a polynomial function and the at least one distortion setting may therefore comprise a set of coefficients $\{p_i\}$ for polynomial distortion. In other words the first transfer function of the pre-distortion module 202 may be a polynomial function.

Consider that the input value $S_{IN}$ has an instantaneous value of x. The distortion inherent in the amplifier driver circuitry, e.g. the distortion introduced by amplifier module 102 and downstream components, effectively results in a non-linearity of amplification. The inherent distortion in the downstream signal path can be reasonably modelled as a polynomial distortion, and can be substantially cancelled by applying a suitable polynomial pre-distortion as the first transfer function.

For example consider that the transfer function k(x) associated with the signal path including distortion can be approximated as:

$$k(x)=x+k_2 \cdot x^2+k_3 \cdot x^3 \qquad \text{Eqn. (1)}$$

If the controlled pre-distortion is controlled according to:

$$p(x)=x+p_2 \cdot x^2+p_3 \cdot x^3 \qquad \text{Eqn. (2)}$$

then the output derived by cascading k(x) after p(x) is:

$$k(p(x)) = p(x) + k_2 \cdot (p(x))^2 + k_3 \cdot (p(x))^3 \quad \text{Eqn. (3)}$$
$$= x + p_2 \cdot x^2 + p_3 \cdot x^3 + k_2 \cdot (x + p_2 \cdot x^2 + p_3 \cdot x^3)^2 +$$
$$k_3 \cdot (x + p_2 \cdot x^2 + p_3 \cdot x^3)^3$$

If $p_2$ and $p_3$ are adapted such that $p_2 = -k_2$ and $p_3 = 2 \cdot k_2^2 - k_3$, then:

$$k(p(x)) = x - k_2 \cdot x^2 + (2 \cdot k_2^2 - k_3) \cdot x^3 + k_2 \cdot (x - k_2 \cdot x^2 + \quad \text{Eqn. (4)}$$
$$(2 \cdot k_2^2 - k_3) \cdot x^3)^2 + k_3 \cdot (x - k_2 \cdot x^2 +$$
$$(2 \cdot k_2^2 - k_3) \cdot x^3)^3$$
$$= x + x^2(-k_2 + k_2) + x^3(2 \cdot k_2^2 - k_3 + 2 \cdot k_2^2 + k_3) +$$
$$O(x^4)$$
$$= x + O(x^4)$$

where $O(x^4)$ indicates all terms of power $x^4$ or higher.

Thus it can be seen that all the second and third order effects of the distortion are cancelled and only some small higher order terms remain.

In general this method can be expanded for higher order cancellation, i.e. the distortion may be modelled by:

$$k(x) = k_1 \cdot x + k_2 \cdot x^2 + k_3 \cdot x^3 + \ldots + k_N \cdot x^N \quad \text{Eqn. (5)}$$

and the controlled pre-distortion, i.e. the first transfer function, may be applied according to:

$$p(x) = p_1 \cdot x + p_2 \cdot x^2 + p_3 \cdot x^3 + \ldots + p_N \cdot x^N \quad \text{Eqn. (6)}$$

Thus it can be seen that an appropriate transfer function can be derived with a certain set of polynomial coefficients $\{p_i\}$ that can be applied as a controlled distortion to the input signal to mitigate for the effects of the inherent distortion.

A distortion setting controller 602 may therefore control a set of distortion settings, e.g. polynomial coefficients $\{p_i\}$, for the non-linear function applied by the transform module 601.

On power-on or reset of the audio driving circuit 201, a set of stored polynomial coefficients $\{p_i\}$ may be retrieved from a store 603, such as a memory or look-up table (LUT) or the like. This initial set of coefficients $\{p_i\}$ may be a default set of predetermined coefficients to be used and/or a stored version of the most recent used coefficients when the pre-distortion module was last operated. In some embodiments there may be several possible sets of distortion characteristics $\{p_i\}_j$ with an appropriate set being selected for use based on one or more determined operating parameter such as impedance of a connected load and/or temperature as will be described in more detail later. The distortion setting controller 602 may therefore select an appropriate starting set of distortion settings for to be used by the transform module 601.

In any case the selected set of coefficients are then used by the transform module 601 to apply an appropriate polynomial first transfer function p(x) to the input signal $S_{IN}$ to provide the controlled distortion to provide a pre-distorted digital signal $S_P$.

Figure 7:
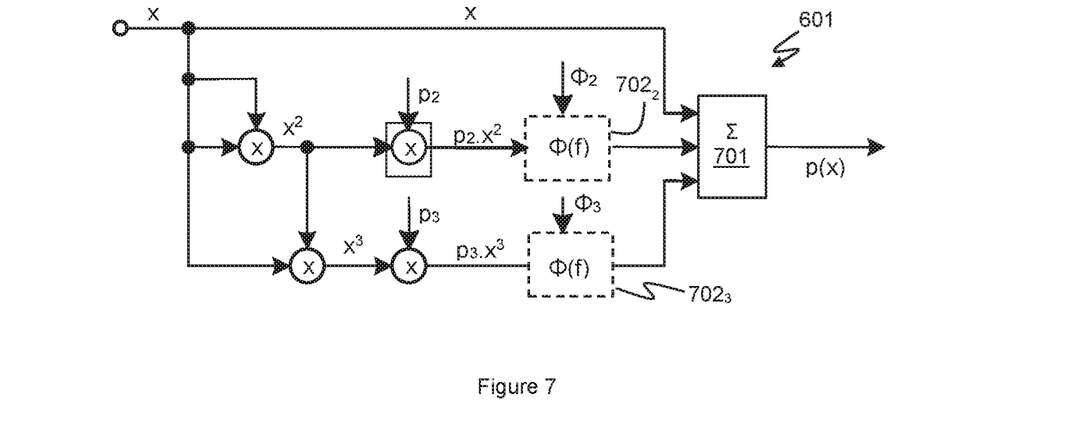
FIG. 7 illustrates an example of a transform module.

In some embodiments the controlled distortion, i.e. the polynomial first transfer function p(x), may be applied to the signal using dedicated hardware. For example FIG. 7 illustrates one example of a suitable transform module 601 for applying a controlled distortion which is polynomial function of the third order. The input signal, represented by the term "x", is split into three paths. In a first path the input signal x passes directly to summation block 701. In a second path the input signal x is multiplied by itself and then subsequently by the relevant coefficient $p_2$ before being input to the summation block 701. In the third path the $x^2$ term from the second path is multiplied by the input signal x again and then by the relevant coefficient $p_3$. Equally however the transform module 701 could be implemented by a suitable a general-purpose digital signal processor (DSP) running appropriate code, which processor may already be performing other processing or pre-conditioning of the audio signal data stream. The appropriate code may be stored in a non-transitory fashion in memory in the host device.

In some embodiments the controlled distortion may be applied according to other transfer functions than a polynomial. For example the transfer function, or its deviation from a constant slope, may be defined in terms of a piecewise linear characteristic, characterised by coefficients denoting break points (abscissae and/or ordinates) between which the transfer function is linearly interpolated. Other possibilities include various known spline methods of interpolating according to fixed parameters or coefficients.

The discussion above has discussed use of a scalar function, for example a real polynomial function, such as a scalar Taylor-type polynomial to compensate for the inherent distortion components. This will provide suitable compensation for a wide variety of cases. It does however assume that the inherent distortion components are phase aligned with fundamental signal. In many cases this assumption will be valid and, as mentioned, such a polynomial function may provide adequate compensation. In at least some embodiments however the components of the amplifier module 102 may be such that at least some inherent distortion components may be out of phase with the fundamental by various amounts.

In some embodiments therefore at least some distortion coefficients may have an associated phase delay component (which may have a value zero for some coefficients of a given set of coefficients). For example the distortion coefficients could be stored as complex variables, rather than scalar variables, with the magnitude providing the amount of distortion, e.g. $p_2$ and the phase indicating the phase delay, e.g. $\Phi_2$. The pre-distortion module may thus be configured to apply the distortion component corresponding to each distortion coefficients so that the applied distortion component is delayed with respect to the fundamental signal by the indicated phase shift.

A transform module 601 implemented by dedicated circuitry may therefore comprise delays $702_2$, $702_3$ in the paths for deriving the distortion components. The delays $702_2$, $702_3$ may provide a phase delay as a function of frequency and may, for example be provided by an all-pass filter arrangement as would be understood by one skilled in the art.

Referring back to FIG. 6 the distortion setting controller 602 thus selects the initial distortion settings to be applied, e.g. the chosen set of polynomial coefficients $\{p_i\}$. The transform module operates to apply the transfer function based on these distortions settings to the input signal $S_{IN}$.

In the embodiment of FIG. 6 the first error signal $\varepsilon_1$ is used to adapt the distortion settings. As mentioned above in embodiments of the present invention the first error signal $\varepsilon_1$ may be indicative of the non-linear error between the input signal $S_{IN}$ and the feedback signal $S_{FB}$ of the audio driving signal $V_{OUT}$, after correction for the linear component of the transfer function of the forward signal path.

This first error signal $\varepsilon_1$ is applied to the distortion setting controller 602 which controls adjustment of the distortion settings based on the determined error.

The distortion setting controller 602 implements an adaptation algorithm to adapt the distortion settings as necessary. In some embodiments the adaptation algorithm may be based on a Least Mean Square (LMS) algorithm for example.

In one embodiment the adaptation algorithm updates the $m^{th}$ polynomial term $p_m$ according to:

$$p_m \rightarrow p_m + \mu \cdot \varepsilon \cdot x^m \qquad \text{Eqn. (7)}$$

where $\mu$ is a predetermined scaling factor.

As discussed previously the first error signal $\varepsilon_1$ may be filtered to mitigate the effects of noise, such as quantisation noise, introduced by the ADC 206 and to achieve a desired noise performance. In some embodiments the filtering may be applied by the distortion setting controller 602 as part of the adaptation algorithm. For example the adaptation algorithm updates the $m^{th}$ polynomial term $p_m$ according to:

$$p_m \rightarrow p_m + \mu \cdot \lambda \cdot \varepsilon \cdot x^m \qquad \text{Eqn. (8)}$$

where $\lambda$ is a filter function, for instance a simple Boxcars filter.

The distortion settings are thus updated based on the feedback to improve the controlled distortions applied to the input signal.

Figure 8:
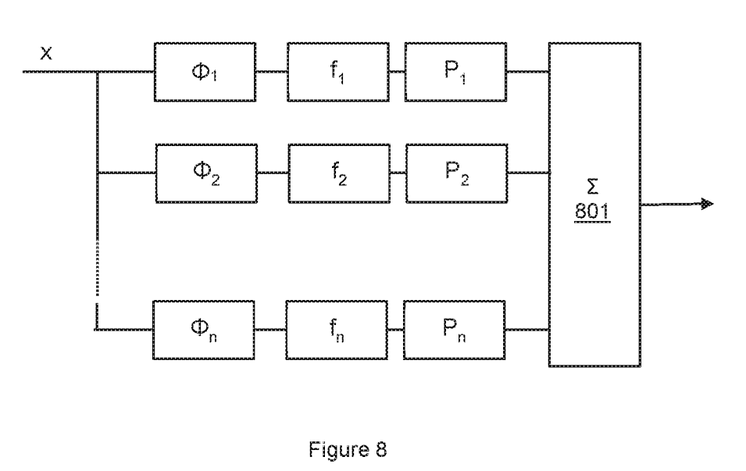
FIG. 8 illustrates a Volterra kernel.

In some embodiments the non-linear transfer function may be applied by processing the input signal according to a Volterra kernel. FIG. 8 illustrates the principles of a Volterra kernel. The input signal is split into a plurality of n different branches, and a different phase shift $\Phi$ and frequency filter f is applied to each branch before an appropriate function P is applied. The Volterra kernel effectively acts as an LMS kernel and performs LMS adaptation with the various phase, shifts and frequency filters and polynomial functions as parameters.

As mentioned above the starting set of distortion settings may be selected from a number of different sets of distortion settings based on some determined operating parameter for the driving circuitry.

In some embodiments a default set of distortion settings, e.g. polynomial coefficients, could be selected as a starting set whatever load is connected in use. The adaptation algorithm applied by the distortion setting controller 602 will, over time, adapt the distortions settings to those appropriate for the connected load. It would also be possible to start with all the polynomial coefficients set to 1, i.e. to apply no distortion, and adapt the coefficients over time. However, in some implementations it may be better for the starting set of distortion settings to be a reasonable estimate of the distortion settings actually required to reduce the time taken for the adjustment algorithm to converge to the correct settings, and thus achieve the best distortion performance, and to reduce the chance that the adaptation algorithm does not converge correctly.

Thus the distortion setting controller 602 may be configured to select a starting set of distortions settings based on at least one operating parameter, such as a characteristic of a connected load, e.g. the impedance $Z_L$ of the connected load. In some embodiments a detection module (not illustrated) may be configured to detect a relevant characteristic of the connected load, which may, for instance, be the impedance of the load $Z_L$ or a characteristic indicative of impedance. In some instance the detection module may also detect the presence of the load.

The distortion setting controller 602 may thus receive an indication of the characteristic of the load, e.g. the load impedance $Z_L$ and select an appropriate set of starting distortions settings. Embodiments of the invention may therefore have a set of stored pre-distortion coefficients $\{p_i\}$, for each of a plurality of different inherent distortion characteristics k(x). Detecting a characteristic of the load effectively identifies the inherent distortion characteristic that will most likely be expected in use and thus allows selection of the most appropriate stored pre-distortion coefficients as a starting point for reducing or cancelling that inherent distortion.

In some instances there may be a set of distortion settings for each of a plurality of impedance bands. A detection module or the distortion setting controller 602 may therefore categorise the load impedance $Z_L$ to a particular impedance band and select the defined settings for that band.

Referring back to FIG. 2, in some embodiments a detection module could be coupled to the output terminal 104 of the driver circuit 201 and may be configured to determine the characteristic of the load through monitoring and/or testing the electrical properties at the terminal 104 when a load is connected. For example a known DC current $I_{ZD}$ could be applied to the relevant contact 106 of the connector 107 and the resultant voltage measured by a detection module—which provides an indication of the load impedance.

It will be appreciated that there are a variety of ways in which the impedance of a connected load, e.g. loudspeaker, may be detected. The applied current could be modulated in some way, e.g. ramped or stepped in a known way and the resultant voltage could monitored using a multi-bit or one-bit, i.e. comparator, quantisation. The current could otherwise be modulated with time e.g. square wave or ultrasonic carrier amplitude. A test voltage may be applied (small and gradually to avoid audible artefacts) and the resulting current detected and digitised or compared. The test signal may be sourced from the amplifier module 102 or selected elements thereof such as high-side drive transistor.

However in some embodiments the detection module may simply receive an indication of the relevant characteristic, for instance from the external apparatus itself via some suitable communication pathway or from some other part of the host device that determines or indicates the characteristic of the load. In other words, the external apparatus may comprise pre-programmed information about its characteristics that may be read by the host device via the connector 107.

The distortion setting controller 602 may thus, on start-up, provide a set of distortion settings, e.g. a set of polynomial coefficients, to the transform module 601, which may have been selected as the most appropriate initial set of distortion settings. In subsequent use the distortion setting controller will receive the first error signal $\varepsilon_1$ and adapt the settings as necessary. The adaptation algorithm will adapt the settings to converge to the settings that minimises the error.

It will be understood that whilst one or more initial distortion settings may be selected based on characteristics of the load, this is not necessarily the case and the first transfer function applied by the pre-distortion is directed at addressing non-linearity due to the amplifier module 102 and/or non-linearity in the signal path to the load. Thus all that is required to adapt the pre-distortion function, i.e. the first transfer function, if the voltage feedback signal $V_{FB}$ and the input signal $S_{IN}$. In embodiments of the disclosure the pre-distortion applied does not try to take into account any non-linearity due to the mechanical operation of the speaker itself, e.g. non-linearity based on movement of a speaker cone, which would require information about the position and/or acceleration of a speaker diaphragm.

For audio driving circuits for driving known, relatively large, speaker loads it is known that the audio signal may be processed based on a model of the loudspeaker and information about the movement of the speaker components so as to try to compensate for non-linearity inherent in the operation of the speaker itself. Such arrangements typically require additional information to determine parameters such as position of the voice coil/diaphragm and rely on a model of the loudspeaker being driven.

Embodiments of the present invention do not rely on a model of a loudspeaker operation. Indeed as mentioned above the audio circuits of embodiments of the disclosure may operate with a range of different loads such as small earbud type speakers or larger speakers of a docking station, which may operate according to quite different acoustic-mechanical models and thus approaches based on a particular loudspeaker model may not operate satisfactorily.

In some embodiments the amplifier arrangement 202 may be operable in a first mode with the feedback path active substantially continually, with a first sample rate for the ADC 206 and in a second mode where the feedback loop is deactivated or run at a reduced rate. On start-up the amplifier arrangement 202 may be operated in the first mode so that the distortion settings for the first transfer function are adapted to values that minimise the error in the output signal. However after a certain period of time or after a certain error value is achieved the amplifier arrangement 202 may switch to the second mode of operation, for at least part of the time, to reduce power. In effect once the first transfer function is calibrated to the present operating conditions the feedback loop may be disabled or run less often to save power with the distortions settings that were derived being maintained.

In some embodiments the feedback path may be disabled in some operating modes of the host device, which may for instance be selected based on a detection of the external load connected. In some instances with the feedback path disabled the pre-distortion module may be operated to apply a first transfer function with a set of fixed distortion settings or to apply no controlled distortion.

Note that as used herein the terms 'module' and 'block' shall both be used to refer to a functional unit for performing the stated function. A module or block may be implemented at least partly by dedicated hardware components such as custom defined circuitry and/or at least partly be implemented by one or more software processors or appropriate code running on a suitable general purpose processor or the like. The appropriate code may be stored in memory in the host device. It should also be noted that any components forming part of one module or block may be shared with another module or block and/or the same processor may implement multiple modules or blocks and may already be performing other control or data processing, which include other processing of the audio signal, e.g. pre-conditioning of the audio signal data stream.

It will be appreciated that the embodiments described above have been described with reference to a single-ended load with a return to ground. It will of course be appreciated that the output could be an H-bridge type arrangement. The principles of operation would be the same as described. The amplifier module 102 may comprise any type of amplifier, for instance of the Class AB type (possibly with Class G or H type power tracking) or a Class D type amplifier (in which case there may be off-chip filter components) whether with fixed or variable power rails. In particular the amplifier module may have variable gain.

Embodiments have been described with reference to an audio driving circuit for driving an audio transducer, which may be an audio transducer or an external device. It will be understood that the audio transducer may however be a transducer of a host device that comprises the audio driving circuit. The transducer may be a haptic transducer for example. The principles of the disclosure would also be applicable to amplification of other types of non-audio signal.

The skilled person will thus recognise that some aspects of the above described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments of the present invention will be implemented on a DSP (Digital Signal Processor), ASIC (Application Specific Integrated Circuit) or FPGA (Field Programmable Gate Array). Thus the code may comprise conventional program code or microcode or, for example, code for setting up controlling an ASIC or FPGA. The code may also comprise code for dynamically configuring re-configurable apparatus such as re-programmable logic gate arrays. Similarly, the code may comprise code for a hardware description language such as Verilog™ or VHDL. As the skilled person will appreciate, the code may be distributed between a plurality of coupled components in communications with one another. Where appropriate, the embodiments may also be implemented using code running on a field-(re)programmable analogue array or similar device in order to configure analogue hardware.

Some embodiments of the present invention may be arranged as part of an audio processing circuit, for instance an audio circuit which may be provided in a host device. A circuit according to an embodiment of the present invention may be implemented as an integrated circuit. One or more speakers may be connected to the integrated circuit in use.

Embodiments of the present invention may be implemented in a host device, especially a portable and/or battery powered host device such as a mobile telephone, an audio player, a video player, a PDA, a mobile computing platform such as a laptop computer or tablet and/or a games device, for example.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope. Terms such as amplify or gain include possible applying a scaling factor or less than unity to a signal.

The invention claimed is:
1. An audio driving circuit comprising:
a forward signal path between an input for receiving an input audio signal and an output for outputting an audio driving signal;

an amplifier module in the forward signal path;

a pre-distortion module operable to apply a first transfer function to a signal in the forward signal path upstream of the amplifier module, wherein the first transfer function comprises a non-linear distortion function based on at least one distortion setting;

an error block for receiving a first signal derived from the input signal and a second signal indicative of the voltage of the audio driving signal and determining a first error signal indicative of a difference between the first and second signals, wherein the error block comprises a first processing module configured to apply a first linear transfer function to one of the first signal or the second signals to compensate for a linear transfer function of the forward signal path prior to determining the first error signal; and an analogue-to-digital conversion module for receiving an analogue feedback signal derived from the audio driving signal and outputting a corresponding digital signal as said second signal, wherein the analogue-to-digital conversion module comprises an analogue-to-digital converter (ADC) and an analogue gain element configured to apply analogue gain to the analogue feedback signal before the ADC, wherein the analogue gain element is configured to apply said analogue gain to so as to limit the input to the ADC to lie within a first predetermined voltage range that corresponds to a linear operating range of the ADC.

2. An audio driving circuit as claimed in claim 1, wherein the first processing module is configured to apply a least-mean-squares adaptation to the first linear transfer function based on the second error signal or to apply a recursive-mean-squares adaptation to the first linear transfer function based on the second error signal.

3. An audio driving circuit as claimed in claim 1, wherein the first processing module is configured to apply the first linear transfer function to one of the first signal or the second signal and further comprising a second processing module configured to apply a second linear transfer function to the other of the first signal or the second signal.

4. An audio driving circuit as claimed in claim 1, further comprising a gain element configured to apply a gain to one of the first or second signals to compensate for a gain in the forward signal path.

5. An audio driving circuit as claimed in claim 1 wherein the analogue-to-digital conversion module further comprises a digital gain element for applying digital gain to a signal output from the ADC, wherein said digital gain at least partly reverses the analogue gain applied by the analogue gain element.

6. An audio driving circuit as claimed in claim 5 wherein the analogue-to-digital conversion module further comprises a gain controller for controlling the analogue gain and the digital gain based on an indication of the magnitude of the audio driving signal.

7. An audio driving circuit as claimed in claim 1 wherein the audio driving circuit is implemented as an integrated circuit and wherein the analogue-to-digital conversion module is configured to receive the analogue feedback signal externally from the integrated circuit.

8. An audio driving circuit as claimed in claim 1, wherein the pre-distortion module comprises a distortion setting controller configured to apply an adaptation algorithm to adapt said at least one distortion setting based on the first error signal.

9. An audio driving circuit as claimed in claim 1, wherein the pre-distortion module is configured, on start-up of the audio driving circuit, to generate an initial set of distortion settings to be used as said at least one distortion setting.

10. An audio driving circuit as claimed in claim 1, wherein the first transfer function is based on a polynomial function and said at least one distortion setting comprises a set of one or more distortion coefficients for said polynomial function.

11. An audio driving circuit as claimed in claim 1 wherein the first processing module is configured such that the first linear transfer function is adaptive based on a second error signal, and wherein the second error signal is indicative of a difference between the first and second signals after the first linear transfer function has been applied.

12. An audio driving circuit as claimed in claim 1, implemented as an integrated circuit.

13. An audio apparatus comprising an audio driving circuit as claimed in claim 1.

14. An audio apparatus as claimed in claim 13 wherein the output of the audio driving circuit is coupled to an output audio path that comprises at least one non-linear component wherein said second signal indicative of the voltage of the audio driving signal is derived from the output audio path downstream of the at least one non-linear component.

15. An audio apparatus as claimed in claim 13 further comprising a first connector for removably connecting to a mating second connector of a peripheral device wherein the apparatus is operable, in use, to supply the audio driving signal to the first connector for driving an audio transducer of a connected peripheral device.

16. An audio apparatus as claimed in claim 13 wherein the audio apparatus comprises at least one of: a battery powered device; a portable device; a communications device; a mobile telephone; a smartphone; a computing device; a laptop; notebook or tablet computer; a gaming device; a personal media player; a wearable device; a voice controlled device.

17. An audio driving circuit comprising:
a pre-distortion module operable to apply an adaptive non-linear distortion function to an input audio signal;
an amplifier for amplifying the output of the pre-distortion module to provide an audio driving signal;
a controller for adapting the non-linear distortion function applied based on a first error signal;
an error block configured to receive the input audio signal and a feedback signal of the voltage of the audio driving signal, to apply a first linear transfer function to the input audio signal or the feedback signal to at least partly compensate for a linear transfer function associated with the amplifier and to determine an error between the input audio signal and the feedback signal after the linear transfer function is applied as the first error signal; and
an analogue-to-digital conversion module for receiving an analogue feedback signal derived from the audio driving signal and outputting a corresponding digital signal as said second signal, wherein the analogue-to-digital conversion module comprises an analogue-to-digital converter (ADC) and an analogue gain element configured to apply analogue gain to the analogue feedback signal before the ADC, wherein the analogue gain element is configured to apply said analogue gain to so as to limit the input to the ADC to lie within a first predetermined voltage range that corresponds to a linear operating range of the ADC.

18. An audio driving circuit for receiving an input audio signal and an output for outputting an audio driving signal, the audio driving circuit comprising:

an amplifier;
a pre-distortion module operable to apply an adaptive non-linear distortion function to the input audio signal;
an error block for determining a first error signal indicative of any error between the input audio signal and the audio driving signal based on a feedback signal of the voltage of the audio driving signal, wherein an analogue-to-digital conversion module is provided for receiving an analogue feedback signal derived from the audio driving signal and outputting a corresponding digital signal as a second signal, and wherein the analogue-to-digital conversion module comprises an analogue-to-digital converter (ADC) and an analogue gain element configured to apply analogue gain to the analogue feedback signal before the ADC the analogue gain element configured to apply said analogue gain to so as to limit the input to the ADC to lie within a first predetermined voltage range that corresponds to a linear operating range of the ADC;
wherein the pre-distortion module comprises a controller for adapting the non-linear distortion function applied based on the first error signal.

* * * * *